(12) United States Patent
Takebayashi et al.

(10) Patent No.: US 9,362,886 B2
(45) Date of Patent: Jun. 7, 2016

(54) ELECTRONIC COMPONENT, OSCILLATOR, ELECTRONIC APPARATUS, AND MOVING OBJECT

(71) Applicant: Seiko Epson Corporation, Tokyo (JP)

(72) Inventors: Yuichi Takebayashi, Sagamihara (JP); Koji Hosaka, Minamiminowa (JP); Yoshiyuki Yamaguchi, Minowa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/841,994

(22) Filed: Sep. 1, 2015

(65) Prior Publication Data

US 2016/0065170 A1 Mar. 3, 2016

(30) Foreign Application Priority Data

Sep. 2, 2014 (JP) ................................ 2014-177810

(51) Int. Cl.
| | |
|---|---|
| *H03B 5/32* | (2006.01) |
| *H01L 41/053* | (2006.01) |
| *H01L 41/083* | (2006.01) |
| *H01L 41/297* | (2013.01) |
| *H03H 9/10* | (2006.01) |
| *H03H 9/19* | (2006.01) |
| *H03H 9/13* | (2006.01) |

(52) U.S. Cl.
CPC .............. *H03H 9/131* (2013.01); *H01L 41/053* (2013.01); *H01L 41/083* (2013.01); *H01L 41/297* (2013.01); *H03B 5/32* (2013.01); *H03H 9/10* (2013.01); *H03H 9/19* (2013.01)

(58) Field of Classification Search
CPC ... H01L 41/053; H01L 41/083; H01L 41/297; H01L 41/311; H03B 5/30; H03B 5/32; H03H 9/02913; H03H 9/10; H03H 9/131; H03H 9/19

USPC ............. 310/344, 348; 331/67, 154, 156, 158
See application file for complete search history.

(56) References Cited

U.S. PATENT DOCUMENTS

| | | | | |
|---|---|---|---|---|
| 5,459,368 A * | 10/1995 | Onishi | ................. | H03H 9/0542 310/313 R |
| 7,378,780 B2 * | 5/2008 | Mizumura | ........... | H03H 9/0552 310/341 |
| 7,760,034 B2 * | 7/2010 | Moriya | ................. | H03H 9/0542 331/108 D |
| 7,872,537 B2 * | 1/2011 | Tanaka | ................. | H03H 9/0547 331/158 |

(Continued)

FOREIGN PATENT DOCUMENTS

| | | |
|---|---|---|
| JP | 62-001412 U | 1/1987 |
| JP | 04-028479 U | 3/1992 |

(Continued)

*Primary Examiner* — Levi Gannon
(74) *Attorney, Agent, or Firm* — Harness, Dickey & Pierce, P.L.C.

(57) ABSTRACT

An electronic component includes: an oscillation circuit that is electrically connected to a resonator element; and a substrate that includes a first surface on which the oscillation circuit and wiring that is electrically connected with the resonator element and the oscillation circuit to form an oscillation loop are disposed, and a second surface opposite to the first surface. The substrate includes a conductor layer between the first surface and the second surface. The conductor layer overlaps the wiring in a plan view. A distance between the wiring and the conductor layer in a thickness direction as a direction along a direction intersecting the first surface and the second surface is from 0.35 mm to 0.7 mm.

20 Claims, 8 Drawing Sheets

(56) References Cited

U.S. PATENT DOCUMENTS

| | | | | |
|---|---|---|---|---|
| 7,939,768 | B2* | 5/2011 | Hara | H03H 9/0514 174/564 |
| 8,013,683 | B2* | 9/2011 | Arai | H03L 1/04 331/116 FE |
| 8,031,013 | B2* | 10/2011 | Takeuchi | H03H 9/0514 310/348 |
| 2001/0024076 | A1* | 9/2001 | Wajima | H03H 9/0514 310/348 |
| 2002/0036546 | A1* | 3/2002 | Hatanaka | H03B 5/32 331/68 |
| 2006/0012444 | A1 | 1/2006 | Matsumoto | |
| 2007/0126519 | A1* | 6/2007 | Mizumura | H03H 9/0552 331/158 |
| 2007/0229178 | A1* | 10/2007 | Harima | H03B 5/32 331/158 |
| 2013/0187723 | A1* | 7/2013 | Harima | H03B 5/36 331/158 |

FOREIGN PATENT DOCUMENTS

| | | |
|---|---|---|
| JP | 10-022734 A | 1/1998 |
| JP | 2001-144539 A | 5/2001 |
| JP | 2001-177346 A | 6/2001 |
| JP | 2003-110362 A | 4/2003 |
| JP | 2005-217773 A | 8/2005 |
| JP | 2006-033349 A | 2/2006 |
| JP | 2014-030079 A | 2/2014 |
| JP | 2014-049971 A | 3/2014 |

\* cited by examiner

| DISTANCE BETWEEN WIRING AND CONDUCTOR LAYER [mm] | 0.15 | 0.25 | 0.35 | 0.55 | 0.70 |
|---|---|---|---|---|---|
| OSCILLATION CHARACTERISTICS (NEGATIVE RESISTANCE) | NO GOOD | NO GOOD | GOOD | EXCELLENT | EXCELLENT |
| FREQUENCY VARIABLE WIDTH | NO GOOD | GOOD | GOOD | GOOD | EXCELLENT |

ELECTRONIC COMPONENT, OSCILLATOR, ELECTRONIC APPARATUS, AND MOVING OBJECT

BACKGROUND

1. Technical Field

The present invention relates to an electronic component, an oscillator, an electronic apparatus, and a moving object.

2. Related Art

In the related art, in order to obtain a stable frequency in the field of communication apparatuses, an electronic component including an oscillation circuit that outputs a signal at a desired frequency using a resonator element formed from a piezoelectric body such as quartz crystal is used. In order to reduce a frequency variation that occurs when the electronic component is mounted on a mounting board due to the influence of a wiring pattern of the mounting board and a component or circuit disposed in the vicinity of the electronic component, an electronic component has been proposed in which a conductor layer is provided in a substrate of the electronic component. For example, as described in JP-A-2001-177346, a piezoelectric oscillator is disclosed in which a shielding conductive film is formed between a mounting surface and a resonant circuit portion that determines the oscillation frequency of an oscillation circuit.

However, according to the electronic component (piezoelectric oscillator) having the configuration described in JP-A-2001-177346, a frequency variation that occurs when the electronic component is mounted on the mounting board is reduced, but the value of the electrostatic capacitance formed between a wiring pattern provided on the mounting surface of the substrate of the electronic component and the conductor layer provided in the substrate is increased. This increase in electrostatic capacitance value causes an insufficient negative resistance of the oscillation circuit, which may result in unstable oscillation characteristics of the oscillation circuit.

SUMMARY

An advantage of some aspects of the invention is to solve at least a part of the problems described above, and the invention can be implemented as the following forms or application examples.

Application Example 1

An electronic component according to this application example includes: an oscillation circuit that is electrically connected to a resonator element; and a substrate that includes a first surface on which the oscillation circuit and wiring that is electrically connected with the resonator element and the oscillation circuit to form an oscillation loop are disposed, and a second surface opposite to the first surface, wherein the substrate includes a conductor layer between the first surface and the second surface, the conductor layer overlaps the wiring in a plan view, and a distance between the wiring and the conductor layer in a thickness direction as a direction along a direction intersecting the first surface and the second surface is from 0.35 mm to 0.7 mm.

According to this application example, the electronic component includes the substrate and the oscillation circuit, and functions as an oscillator by connecting with the resonator element formed from, for example, a piezoelectric body such as quartz crystal. The substrate includes the conductor layer between the first surface and the second surface opposite to the first surface. The wiring that is connected with the resonator element and the oscillation circuit to form the oscillation loop is disposed on the first surface of the substrate. Since the wiring and the conductor layer overlap each other in the plan view, the electrostatic capacitance value corresponding to the distance between the wiring and the conductor layer in the thickness direction (direction intersecting the first surface and the second surface) is formed between the wiring and the conductor layer. In the electronic component, the distance between the wiring and the conductor layer is set to 0.35 mm or more in order to reduce the electrostatic capacitance value between the wiring and the conductor layer to a predetermined value or less. With this configuration, the value of the electrostatic capacitance formed between the wiring and the conductor layer is stabilized in the electronic component, for example, an oscillator, and it is possible to reduce the possibility of a reduction in the absolute value of the negative resistance of the oscillation circuit. Therefore, it is possible to reduce the possibility of a deterioration in the characteristics, for example, oscillation stability of the oscillator. Hence, it is possible to provide the electronic component in which the possibility of a deterioration in oscillation stability is reduced. Moreover, by setting the distance between the wiring and the conductor layer to 0.7 mm or less, the electronic component has a general height or less as an electronic component, which can contribute to miniaturization.

Application Example 2

An electronic component according to this application example includes: an oscillation circuit that is electrically connected to a resonator element; and a substrate that includes a first surface on which the oscillation circuit and wiring that is electrically connected with the resonator element and the oscillation circuit to form an oscillation loop are disposed, and a second surface opposite to the first surface, wherein the substrate includes a conductor layer between the first surface and the second surface, the conductor layer overlaps the wiring in a plan view, and an electrostatic capacitance value between the wiring and the conductor layer is from 0.6 pF to 0.8 pF.

According to this application example, the electronic component includes the substrate and the oscillation circuit, and functions as an oscillator by connecting with the resonator element formed from, for example, a piezoelectric body such as quartz crystal. The substrate includes the conductor layer between the first surface and the second surface opposite to the first surface. The wiring that is connected with the resonator element and the oscillation circuit to form the oscillation loop is disposed on the first surface of the substrate. Since the wiring and the conductor layer overlap each other in the plan view, the electrostatic capacitance value corresponding to the distance between the wiring and the conductor layer is formed between the wiring and the conductor layer. In the electronic component, the electrostatic capacitance value between the wiring and the conductor layer is set to 0.8 pF or less. With this configuration, the value of the electrostatic capacitance formed between the wiring and the conductor layer is stabilized in the electronic component, for example, an oscillator, and it is possible to reduce the possibility of a reduction in the absolute value of the negative resistance of the oscillation circuit. Therefore, it is possible to reduce the possibility of a deterioration in the characteristics, for example, oscillation stability of the oscillator. Moreover, since the electrostatic capacitance value between the wiring and the conductor layer is set to 0.6 pF or more, it is not necessary to increase the distance between the wiring and the conductor layer more than necessary. The electronic component can be contained in a predetermined height. Hence, it is possible to provide the electronic component in which the possibility of a deterioration in oscillation stability is reduced.

Application Example 3 and Application Example 4

In the electronic component according to the application example described above, it is preferable that the substrate has a relative dielectric constant of from 9 to 10.

According to these application examples, the substrate with a relative dielectric constant of from 9 to 10 is used for the electronic component. As the material of the substrate with a relative dielectric constant of from 9 to 10, for example, alumina ($Al_2O_3$) ceramic can be used. Since ceramic has high rigidity and a low thermal expansion rate, it is possible to provide the electronic component with high reliability by using ceramic for the substrate.

Application Example 5 and Application Example 6

In the electronic component according to the application example described above, it is preferable that the wiring has an area of from 1.65 $mm^2$ to 2.0 $mm^2$.

According to these application examples, the wiring having an area of from 1.65 $mm^2$ to 2.0 $mm^2$ is provided on the substrate of the electronic component. By setting the total area of the wiring to 1.65 $mm^2$ or more, it is possible to provide the wiring for forming the oscillation loop and land patterns of components to be mounted on the wiring. By setting the total area of the wiring to 2.0 $mm^2$ or less, it is possible to configure the substrate in which the electrostatic capacitance value between the wiring and the conductor layer is 0.8 pF (predetermined value) or less.

Application Example 7 and Application Example 8

In the electronic component according to the application example described above, it is preferable that the electronic component further includes an electronic element, and that the electronic element is disposed on the first surface, connected to the wiring, and overlaps the conductor layer in the plan view.

According to these application examples, the electronic component includes the electronic element, such as a passive element including a resistor, a capacitor, and an inductor, or an active element including a semiconductor element, which adjusts, for example, the characteristics of the resonator element, the oscillation circuit, or the like. Since the electronic element is provided at a position overlapping the conductor layer in the plan view, an influence due to the wiring pattern of the mounting board and a component or the like disposed in the vicinity of the electronic component when the electronic component is mounted on the mounting board is reduced, and thus the value of the electrostatic capacitance formed between the electronic element and the conductor layer is stabilized. With this configuration, it is possible to reduce a variation in characteristics as the electronic component before and after the mounting of the electronic component on the mounting board.

Application Example 9 and Application Example 10

In the electronic component according to the application example described above, it is preferable that the electronic element is an inductor.

According to these application example, the electronic component includes, as the electronic element, the inductor that widens a frequency variable range within which a frequency at which the resonator element connected with the electronic component oscillates is variable, and enhances the linearity of the variable range. With this configuration, since the value of the electrostatic capacitance formed between the inductor and the conductor layer is stabilized, it is possible to reduce a variation in frequency variable range width before and after the mounting of the electronic component on the mounting board.

Application Example 11 and Application Example 12

In the electronic component according to the application example described above, it is preferable that the conductor layer is grounded.

According to these application example, since the conductor layer is grounded, the voltage level of the conductor layer becomes constant. With this configuration, the influence due to the wiring pattern of the mounting board and a component or the like disposed in the vicinity of the electronic component when the electronic component is mounted on the mounting board is reduced, and thus the value of the electrostatic capacitance formed between the wiring and the conductor layer is stabilized. Therefore, it is possible to reduce a characteristic variation, for example, a frequency variation before and after the mounting of the electronic component on the mounting board.

Application Example 13 and Application Example 14

An oscillator according to each of these application examples includes: the electronic component according to the application example described above; and the resonator element.

According to these application examples, since the oscillator includes the electronic component capable of obtaining stable oscillation characteristics and the resonator element that oscillates by connecting with the electronic component, it is possible to provide the oscillator capable of obtaining stable oscillation characteristics.

Application Example 15 and Application Example 16

In the oscillator according to the application example described above, it is preferable that the resonator element overlaps the conductor layer in a plan view.

According to these application examples, since the resonator element is provided at a position overlapping the conductor layer in the plan view, an influence due to a wiring pattern of a mounting board and a component or the like disposed in the vicinity of the oscillator when the oscillator is mounted on the mounting board is reduced, and thus the value of the electrostatic capacitance formed between the resonator element and the conductor layer is stabilized. With this configuration, it is possible to reduce a characteristic variation, for example, a frequency variation before and after the mounting of the oscillator on the mounting board.

Application Example 17 and Application Example 18

An electronic apparatus according to each of these application examples includes the electronic component according to the application example described above.

According to these application example, since the electronic apparatus includes the electronic component capable of obtaining stable oscillation characteristics, it is possible to provide the electronic apparatus controlled by stable oscillation characteristics and thus with high reliability.

Application Example 19 and Application Example 20

A moving object according to each of these application examples includes the electronic component according to the application example.

According to these application examples, since the moving object includes the electronic component capable of obtaining stable oscillation characteristics, it is possible to provide the moving object controlled by stable oscillation characteristics and thus with high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
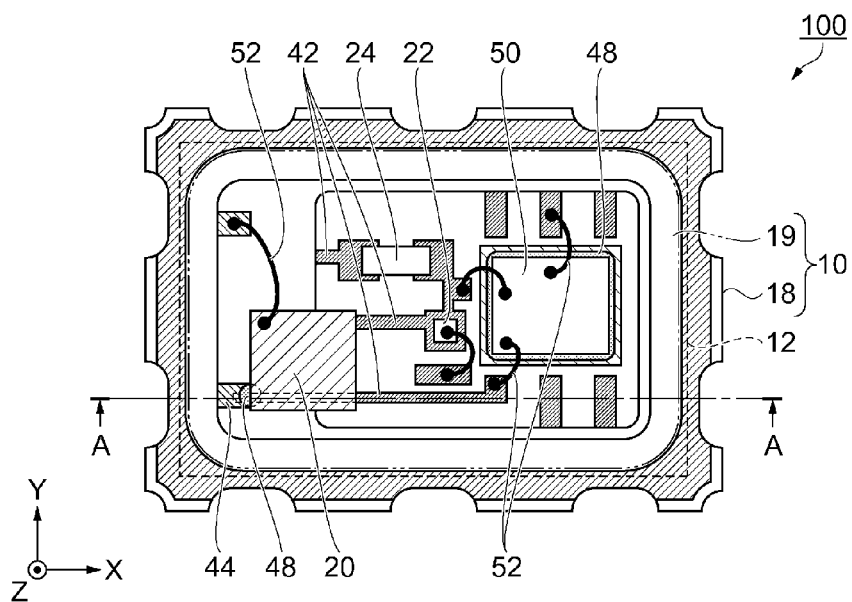
FIG. 1 is a schematic plan view showing a schematic configuration of an oscillator according to Embodiment 1.

Hereinafter, embodiments of the invention will be described with reference to the drawings. In the drawings below, the scales of layers or members are different from actual ones so that the layers or members have a recognizable size.

Moreover, in FIGS. 1, 2, 7, and 8, an X-axis, a Y-axis, and a Z-axis are shown as three axes orthogonal to one another for convenience of description, in which the head side of each arrow indicating the axial direction is defined as "positive side" and the tail side is defined as "negative side". In the following, a direction parallel to the X-axis is referred to as "X-axis direction", a direction parallel to the Y-axis is referred to as "Y-axis direction", and a direction parallel to the Z-axis is referred to as "Z-axis direction".

Embodiment 1

Schematic Configuration of Oscillator

Figure 2:
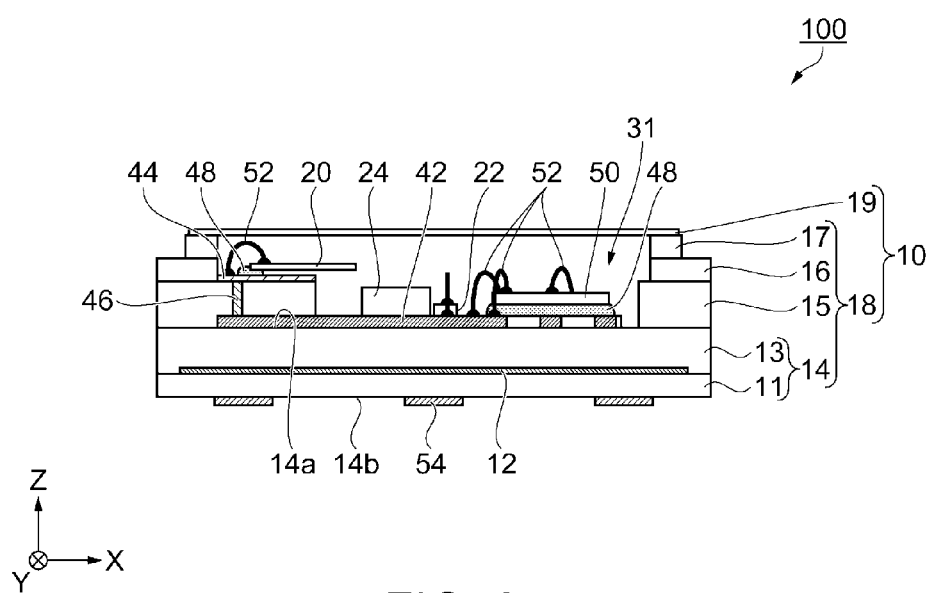
FIG. 2 is a cross-sectional view taken along the line A-A in FIG. 1.

FIG. 1 is a schematic plan view showing a schematic configuration of an oscillator 100 according to Embodiment 1. FIG. 2 is a cross-sectional view taken along the line A-A in FIG. 1. In the oscillator 100 of the embodiment, an electronic component that functions as an oscillator by electrically connecting with a resonator element and a resonator element 20 are included in the same container 10.

First, the schematic configuration of the oscillator 100 according to Embodiment 1 will be described with reference to FIGS. 1 and 2.

As shown in FIGS. 1 and 2, the oscillator 100 includes an oscillation circuit 50, the resonator element 20, a varicap capacitor 22, an inductor 24 as one example of an electronic element, and the container 10. The container 10 includes a package main body 18 and a lid 19. The package main body 18 is formed in a rectangular box shape in order to contain the varicap capacitor 22, the inductor 24, the oscillation circuit 50, and the resonator element 20. The general external dimensions of the container 10 are 7.0 mm length, 5.0 mm width, and 1.5 mm height. In FIG. 1, the lid 19 is shown in a see-through manner for convenience of description. Although the inductor 24 is illustrated as an electronic element, the electronic element is not limited to the inductor. The electronic element may be a passive element such as a resistor or a capacitor, an active element such as a transistor or a diode, a semiconductor circuit element combining the passive and active elements together, or the like.

The package main body 18 is composed of: a substrate 14 that forms the bottom (negative Z-axis side) of the package main body 18; a first frame body 15 that forms an accommodating space for the oscillation circuit 50, the varicap capacitor 22, and the inductor 24, and a support base of the resonator element 20; a second frame body 16 that forms an accommodating space for the resonator element 20; and a seam ring 17 as a bonding material for the lid 19.

The substrate 14 includes a first surface 14a on which the oscillation circuit 50 that is electrically connected to the resonator element 20 is disposed, and a second surface 14b opposite to the first surface 14a. The first surface 14a of the substrate 14 is provided with wiring 42 that is connected with the resonator element 20 and the oscillation circuit 50 to form an oscillation loop. In the oscillator 100 of the embodiment, the oscillation circuit 50, the resonator element 20, the varicap capacitor 22, and the inductor 24 are connected by means of the wiring 42, and the oscillation loop is configured to include the oscillation circuit 50, the resonator element 20, and the inductor 24.

The substrate 14 includes a conductor layer 12 between the first surface 14a and the second surface 14b. Specifically, the substrate 14 is composed of a first substrate 11, a second substrate 13, and the conductor layer 12 formed between the first substrate 11 and the second substrate 13. The conductor layer 12 is provided between the first surface 14a as a surface of the second substrate 13 on the positive Z-axis side, and the second surface 14b as a surface of the first substrate 11 on the negative Z-axis side.

The conductor layer 12 overlaps, in a plan view, the wiring 42 provided on the first surface 14a, and a distance in a thickness direction (Z-axis direction) between the wiring 42 and the conductor layer 12 is from 0.35 mm to 0.7 mm. The inductor 24 and the resonator element 20 that are electrically connected to the wiring 42 overlap the conductor layer 12 in the plan view. With this configuration, when the oscillator 100 is mounted on a mounting board, an influence on the oscillator 100 due to a wiring pattern of the mounting board and a component or the like disposed in the vicinity of the oscillator 100, for example, an electromagnetic coupling between at least a portion of the wiring 42, the inductor 24, and the resonator element 20 and at least a portion of the wiring pattern of the mounting board and the component disposed in the vicinity of the oscillator 100 is reduced, so that the values of electrostatic capacitances formed between the wiring 42 and the conductor layer 12, between the inductor 24 and the conductor layer 12, and between the resonator element 20 and the conductor layer 12 are stabilized. Further, when the oscillator 100 is mounted on the mounting board, the conductor layer functions also as a shield electrode between the wiring, and the wiring pattern of the mounting board and component wiring disposed in the vicinity of the oscillator 100. Hence, it is possible to reduce a frequency variation before and after the mounting of the oscillator 100 on the mounting board. Moreover, since the inductor 24 functions as a so-called extension coil for widening a frequency variable range within which the frequency is adjustable, it is possible to reduce a variation in the frequency variable range width before and after the mounting of the oscillator 100 on the mounting board.

The wiring 42 is provided to have an area of from 1.65 mm$^2$ to 2.0 mm$^2$. When the wiring 42 is provided to have an area of 2.0 mm$^2$ or more, the overlapping area of the wiring 42 and the conductor layer 12 increases, the value of the electrostatic capacitance formed between the wiring 42 and the conductor layer 12 increases, and thus the oscillation characteristics of the oscillator 100 are deteriorated. Conversely, when it is intended to provide the wiring 42 with an area of 1.65 mm$^2$ or less, it is difficult to provide a land pattern for stably connecting the inductor 24 or the varicap capacitor 22 on the wiring 42.

The second surface 14b of the substrate 14 is provided with a plurality of external connection terminals 54 such as a power supply terminal for applying a voltage to the oscillation circuit 50, an output terminal for outputting an oscillation signal output from the oscillation circuit 50, a ground terminal serving as a reference potential of the oscillation circuit 50, and a control voltage input terminal for applying a control voltage to the varicap capacitor 22. The conductor layer 12 is electrically connected with the ground terminal of the external connection terminals 54 by means of internal wiring (not shown).

A material with a relative dielectric constant of from 9 to 10 is used for the substrate 14, the first frame body 15, and the second frame body 16 that constitute the package main body 18. Ceramic with a relative dielectric constant of from 9 to 10 is used for the material of the substrate 14, the distance between the wiring 42 and the conductor layer 12 is set to from 0.35 mm to 0.7 mm, and the area of the wiring 42 is set to from 1.65 mm$^2$ to 2.0 mm$^2$, whereby it is possible to configure the container 10 in which the electrostatic capacitance value between the wiring 42 and the conductor layer 12 is from 0.6 pF to 0.8 pF. As the material with a relative dielectric constant of from 9 to 10, for example, alumina (Al$_2$O$_3$) ceramic can be used. Ceramic has high rigidity and a low thermal expansion rate, and therefore, the reliability of the oscillator 100 can be enhanced by using ceramic for the package main body 18. Although, in the embodiment, ceramic is used for the package main body 18 in the description, an insulating material such as glass or resin, or a composite insulating material of glass and resin may be used other than ceramic as long as the material has a relative dielectric constant of from 9 to 10.

The package main body 18 is formed as follow: the first substrate 11, the second substrate 13, the first frame body 15, and the second frame body 16 each of which is obtained by forming a green sheet in a predetermined shape are stacked and sintered; and the seam ring 17 is brazed to an upper surface (surface on the positive Z-axis side) of the second frame body 16 with, for example, silver solder. The green sheet is obtained by, for example, dispersing ceramic powders in a predetermined solution, adding a binder thereto, and forming the resultant kneaded mixture in a sheet shape. As the material of the seam ring 17, for example, Kovar (alloy of iron, nickel, and cobalt) can be used.

The package main body 18 includes an opening on the positive Z-axis side. The seam ring 17 that forms the opening of the package main body 18 and the lid 19 are sealed using, for example, a resistance welding method (seam welding). As the material of the lid 19, for example, Kovar can be used. An inert gas atmosphere such as nitrogen or argon or a reduced-pressure atmosphere with a lower pressure than the atmospheric pressure is established in the interior of a sealed cavity 31 of the package main body 18.

In the embodiment, the package main body 18 including the seam ring 17 and the lid 19 are sealed using seam welding for the container 10 in the description. However, a method may be employed in which a package main body not including the seam ring 17 and a lid including a brazing material are used to be sealed using direct seam welding, or a method may be employed in which the brazing material is melted by putting the package main body and the lid into a furnace to thereby seal them together. Moreover, a material such as glass or resin may be used as the brazing material.

The oscillation circuit 50 is bonded to the first surface 14a of the substrate 14 via a connection member 48 such as an adhesive. Terminals of the oscillation circuit 50 and the wiring 42 or the like are electrically connected via bonding wires 52. As the material of the bonding wire 52, for example, metal such as gold (Au) or aluminum (Al), or an alloy containing the metal as a main component can be used. The oscillation circuit 50 may be bonded to the first surface 14a of the substrate 14 via bumps formed of a conductive material such as gold (Au) or solder, and may be electrically connected with the wiring 42 or the like simultaneously with the bonding. Alternatively, the oscillation circuit 50 may be bonded to the first surface 14a of the substrate 14 via a bonding member such as a conductive adhesive, and may be electrically connected with the wiring 42 or the like simultaneously with the bonding. The varicap capacitor 22 and the inductor 24 are connected via conductive bonding members such as solder or a conductive adhesive to land patterns provided in the wiring 42.

The first frame body 15 has a function as a support base to fix the resonator element 20. An inner wall of the first frame body 15 on the cavity 31 side extends into the cavity 31 beyond an inner wall of the second frame body 16, and the extending portions, which extend from the negative X-axis direction, are each provided with an internal electrode 44 on the surface on the positive Z-axis side.

The resonator element 20 is bonded and supported to the internal electrode 44 via the connection member 48 having conductivity. One of electrodes of the resonator element 20 is electrically connected with the internal electrode 44 via the connection member 48, while the other electrode of the resonator element 20 is electrically connected with the internal electrode 44 via a bonding wire 52. The resonator element 20 may be bonded and supported to the internal electrode 44 only with the connection member 48 having conductivity, or the resonator element 20 may be bonded and supported to the first frame body 15 via a connection member not having conductivity and may be electrically connected with the internal electrode 44 only via the bonding wire 52.

The internal electrode 44 is electrically connected with the wiring 42 via a via hole 46 that is disposed to penetrate from the surface of the first frame body 15 on the positive Z-axis side to the surface thereof on the negative Z-axis side. With this configuration, the oscillation circuit 50 and the resonator element 20 are electrically connected.

As the material of the conductor layer 12, the wiring 42, the internal electrode 44, and the external connection terminal 54, for example, a silver (Ag)/palladium (Pd) alloy, tungsten (W), or the like can be used. The conductor layer 12, the wiring 42, the internal electrode 44, and the external connection terminal 54 can be formed by metalizing the surfaces of ceramic as the material of the first substrate 11, the second substrate 13, and the first frame body 15 with an Ag/Pd alloy, tungsten, or the like, and then baking the metalized Ag/Pd alloy, tungsten, or the like. Thereafter, plating treatment with metal such as nickel (Ni), gold (Au), or silver (Ag) is applied to the surfaces.

Electrostatic Capacitance Value

Next, the electrostatic capacitance value will be described.

Figure 3:
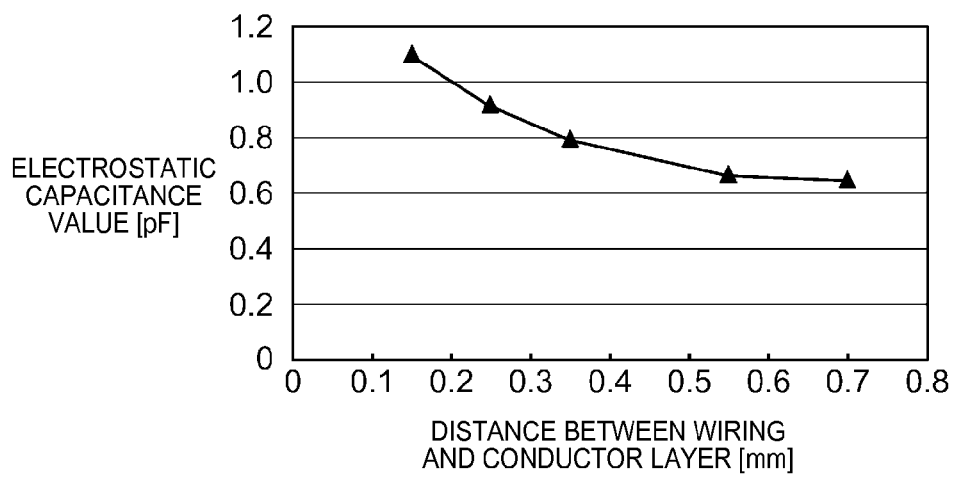
FIG. 3 is a graph showing the relation between a distance between wiring and a conductor layer and an electrostatic capacitance value.

FIG. 3 is a graph showing the relationship between the distance between the wiring 42 and the conductor layer 12 and the electrostatic capacitance value between the wiring 42 and the conductor layer 12. The numerical value on the horizontal axis in FIG. 3 represents the distance between the wiring 42 and the conductor layer 12, while the numerical value on the vertical axis represents the electrostatic capacitance value between the wiring 42 and the conductor layer 12. FIG. 3 shows the results of obtaining the electrostatic capacitance value between the wiring 42 and the conductor layer 12 (ground terminal) in an oscillator fabricated using the package main body 18 with the thickness of the second substrate 13 in the Z-axis direction, which corresponds to the distance between the wiring 42 and the conductor layer 12, being as a parameter in the oscillator 100 having the configuration shown in FIGS. 1 and 2.

As shown in FIG. 3, when the distance between the wiring 42 and the conductor layer 12 is 0.15 mm, the electrostatic capacitance value is about 1.1 pF, and when the distance between the wiring 42 and the conductor layer 12 is 0.7 mm or more, the electrostatic capacitance gradually approaches 0.6 pF. It is found from this that even when the distance between the wiring 42 and the conductor layer 12 is increased to 0.7 mm or more, the effect of reducing the electrostatic capacitance value is small. Moreover, by setting the distance between the wiring 42 and the conductor layer 12 to 0.7 mm or less, the oscillator 100 with a predetermined height of 1.5 mm or less can be realized.

Negative Resistance

Here, the negative resistance will be described.

Figure 4A:
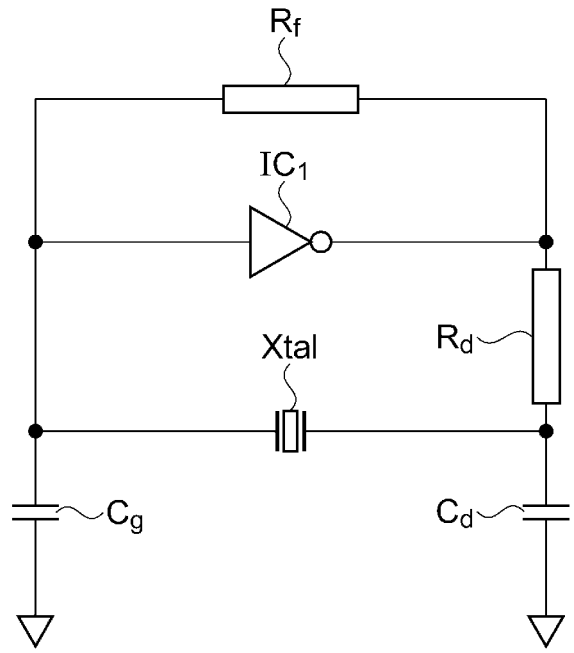
FIGS. 4A and 4B are diagrams showing an oscillation circuit as one example for explaining a negative resistance and an equivalent circuit of the oscillation circuit.
Figure 4B:
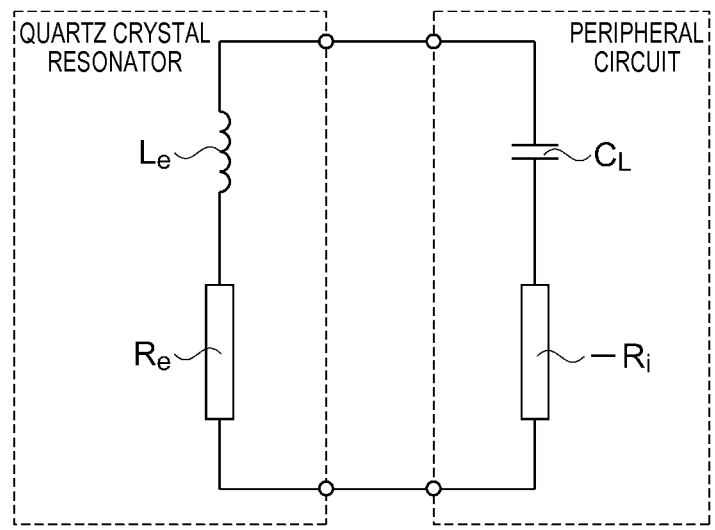

FIGS. 4A and 4B are diagrams showing an oscillation circuit as one example for explaining the negative resistance, and the equivalent circuit of the oscillation circuit. FIG. 4A shows a quartz crystal oscillation circuit using a CMOS inverter. FIG. 4B shows the equivalent circuit of the quartz crystal oscillation circuit in FIG. 4A.

As shown in FIG. 4A, the oscillation circuit connected to a quartz crystal resonator Xtal is configured to include a CMOS inverter $IC_1$, capacitors $C_g$ and $C_d$, and resistors $R_f$ and $R_d$. An input terminal of the CMOS inverter $IC_1$ is connected to an output terminal of the quartz crystal resonator Xtal. The resistor $R_d$ (damping resistor) is connected between an output terminal of the CMOS inverter $IC_1$ and an input terminal of the quartz crystal resonator Xtal. The resistor $R_f$ (feedback resistor) is connected between the input and output terminals of the CMOS inverter $IC_1$. The output terminal of the quartz crystal resonator Xtal is connected to one end of the capacitor $C_g$, and the other end of the capacitor $C_g$ is grounded. The input terminal of the quartz crystal resonator Xtal is connected to one end of the capacitor $C_d$, and the other end of the capacitor $C_g$ is grounded.

As shown in the equivalent circuit of FIG. 4B, the equivalent circuit of the quartz crystal resonator Xtal can be considered as a series circuit of an equivalent resistance $R_e$ and an equivalent effective reactance $L_e$ when only an inductive characteristic region to be used in an actual oscillation circuit is considered. A peripheral circuit including the CMOS inverter $IC_1$ as viewed from the quartz crystal resonator Xtal can be considered as a series circuit of an equivalent input capacitance $C_L$ and a negative resistance $-R_i$. In the equivalent circuit, the negative resistance $R_i$ is denoted by "$-R_i$" with the minus sign indicating a negative value. That is, "$-R_i$" represents a negative numerical value.

The oscillator shown in FIG. 4A can continue to oscillate at a predetermined frequency ω under the following relation.

the absolute value of the negative resistance $|R_i| \geq$ the equivalent resistance $R_e$ Moreover, in order to reliably activate the oscillator, the absolute value of the negative resistance $|R_i|$ needs to be increased to approximately 3 to 10 times the equivalent resistance $R_e$. The negative resistance $R_i$ is expressed by the following equation.

$$Ri = \frac{-g_m}{\omega^2 C_g C_d} \quad (1)$$

where $g_m$ represents the transfer conductance of the CMOS inverter $IC_1$.

When the distance between the wiring 42 and the conductor layer 12 is reduced to thereby increase the electrostatic capacitance therebetween, a parallel capacitance is equivalently added to the capacitors $C_g$ and $C_d$ in the oscillation circuit of FIG. 4A. When the parallel capacitance added to the capacitor $C_g$ is a capacitor $\Delta C_g$, and the parallel capacitance added to the capacitor $C_d$ is a capacitor $\Delta C_d$, the negative resistance $R_i$ is expressed by the following equation.

$$Ri = \frac{-g_m}{\omega^2 (C_g + \Delta C_g)(C_d + \Delta C_d)} \quad (2)$$

$$= \frac{-g_m}{\omega^2 C_g C_d + \omega^2 (C_g \Delta C_d + C_d \Delta C_g + \Delta C_g \Delta C_d)}$$

As is apparent by comparing the equation (1) with the equation (2), since the term $(C_g \Delta C_d + C_d \Delta C_g + \Delta C_g \Delta C_d)$ is added to the denominator of the equation (2), the negative resistance $R_i$ decreases as the electrostatic capacitance between the wiring 42 and the conductor layer 12 increases. Therefore, the oscillation of the oscillator is not activated, or it takes time to start the oscillation, so that oscillation characteristics are deteriorated.

Circuit Configuration

Next, the circuit configuration of the oscillator 100 will be described.

Figures 5, 6:
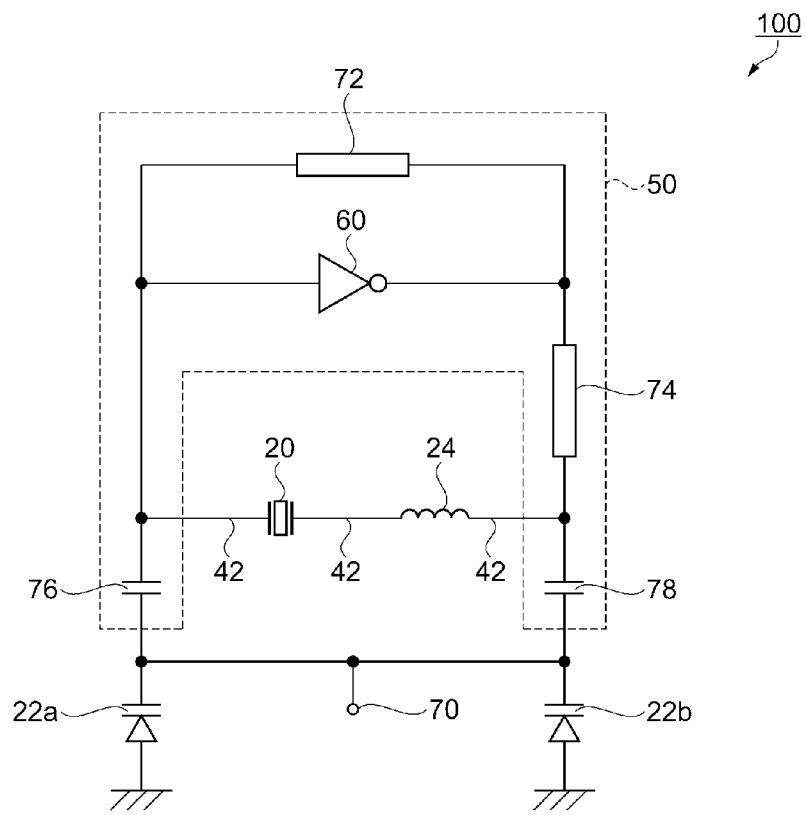
FIG. 5 is a diagram showing a circuit configuration of the oscillator.
FIG. 6 is a table showing the relation among the distance between the wiring and the conductor layer, oscillation characteristics, and a frequency variable width.

FIG. 5 is a diagram showing the circuit configuration of the oscillator 100. As shown in FIG. 5, the oscillator 100 is configured to include the resonator element 20, the oscillation circuit 50, the inductor 24, and varicap capacitors 22a and 22b. The oscillation circuit 50 is configured to include a CMOS inverter 60, resistors 72 and 74, and capacitors 76 and 78. The oscillator 100 of the embodiment is a voltage-controlled quartz crystal oscillator (VCXO). The oscillator 100 outputs an oscillation signal at a frequency adjusted in response to a control voltage from the outside. The oscillator 100 and the oscillation circuit 50 may each employ a configuration in which a portion of these elements is omitted or changed or another element is added to these elements.

An input terminal of the CMOS inverter 60 is connected to an output terminal of the resonator element 20 via the wiring 42. An input terminal of the resonator element 20 is connected to one end of the inductor 24 via the wiring 42. The other end of the inductor 24 and an output terminal of the CMOS inverter 60 are connected via the wiring 42 and the resistor 74. The resistor 72 (feedback resistor) is connected between the input and output terminals of the CMOS inverter 60. This forms the oscillation loop from the output terminal of the resonator element 20 through the CMOS inverter 60, the resistor 74, and the inductor 24 to the input terminal of the resonator element 20. The oscillation circuit 50 configured as described above amplifies, with the CMOS inverter 60 being as an amplifying element, an output signal output from the output terminal of the resonator element 20, and supplies the amplified signal as an input signal from the input terminal of the resonator element 20.

The output terminal of the resonator element 20 is connected to one end of the capacitor 76. The other end of the capacitor 76 is connected to a cathode terminal of the varicap capacitor 22a. The other end of the inductor 24 is connected to one end of the capacitor 78. The other end of the capacitor 78 is connected to a cathode terminal of the varicap capacitor 22b. An anode terminal of the varicap capacitor 22a and an anode terminal of the varicap capacitor 22b are grounded.

The cathode terminal of the varicap capacitor 22a and the cathode terminal of the varicap capacitor 22b are connected to a VC terminal 70. A control voltage is applied from the VC terminal 70 to the cathode terminals of the varicap capacitors 22a and 22b. In response to the voltage value of the control voltage, the capacitance values of the varicap capacitors 22a and 22b are set, and the frequency of the oscillation signal transmitted from the output terminal of the CMOS inverter 60 is adjusted. The control voltages to be applied to the respective varicap capacitors 22a and 22b may be different. Further, a configuration including only one of the varicap capacitors 22a and 22b may be employed.

Although, in the embodiment, the CMOS inverter 60 is used as an amplifying element in the description, the amplifying element is not limited to the CMOS inverter. As the amplifying element, a bipolar transistor, a field-effect transistor (FET), a metal-oxide-semiconductor field-effect transistor (MOSFET), a thyristor, or the like may be used.

FIG. 6 is a table showing the relationship among the distance between the wiring 42 and the conductor layer 12, oscillation characteristics, and a frequency variable width. FIG. 6 shows the results of evaluation performed by the inventor on the oscillation characteristics and frequency variable ranges of oscillators with the distance between the wiring 42 and the conductor layer 12 being as a parameter.

As shown in FIG. 6, when the distance between the wiring 42 and the conductor layer 12 is 0.35 mm or more, a sufficient negative resistance and favorable oscillation characteristics are obtained. In other words, when the electrostatic capacitance between the wiring 42 and the conductor layer 12 is equal to or less than 0.8 pF, which is the value of the electrostatic capacitance obtained when the distance between the wiring 42 and the conductor layer 12 is 0.35 mm, a sufficient negative resistance and favorable oscillation characteristics are obtained. Further, the distance is desirably 0.55 mm or more with which the electrostatic capacitance gradually approaches 0.6 pF. In other words, the electrostatic capacitance between the wiring 42 and the conductor layer 12 is desirably equal to or less than 0.67 pF, which is the value of the electrostatic capacitance obtained when the distance between the wiring 42 and the conductor layer 12 is 0.55 mm. Moreover, when the distance between the wiring 42 and the conductor layer 12 is 0.25 mm or more, a desired frequency variable range is obtained. Based on the results, in the oscillator 100 of the embodiment, the distance between the wiring 42 and the conductor layer 12 is set to 0.35 mm or more, and the electrostatic capacitance value between the wiring 42 and the conductor layer 12 is set to 0.8 pF or less. With this configuration, the oscillator 100 can secure a negative resistance with which favorable oscillation characteristics can be obtained. Moreover, from the results, also under the condition that the distance between the wiring 42 and the conductor layer is 0.7 mm, the oscillator 100 can obtain a desired frequency variable range and secure a negative resistance with which favorable oscillation characteristics can be obtained.

Although the oscillator 100 has been illustrated as a voltage-controlled quartz crystal oscillator (VCXO), the type of the resonator element or the oscillator is not limited to the VCXO. As a resonator element, for example, a SAW (Surface Acoustic Wave) resonator, an AT-cut quartz crystal resonator, an SC-cut quartz crystal resonator, a tuning fork-type quartz crystal resonator, another piezoelectric resonator, a MEMS (Micro Electro Mechanical Systems) resonator, or the like may be used.

As the substrate material of the resonator element, piezoelectric single crystal such as quartz crystal, lithium tantalate, or lithium niobate, a piezoelectric material such as piezoelectric ceramic including lead zirconate titanate, a silicon semiconductor material, or the like may be used. Further, as a means of exciting the resonator element, excitation using a piezoelectric effect may be used, or electrostatic driving using the Coulomb force may be used.

The type of the oscillator may include a piezoelectric oscillator (such as a quartz crystal oscillator), a SAW oscillator, a voltage-controlled oscillator (such as a VCXO or a VCSO), a temperature-compensated oscillator (such as a TCXO), an oven-controlled oscillator (such as an OCXO), a silicon oscillator, and an atom oscillator.

As described above, according to the oscillator 100 according to the embodiment, the following advantageous effects can be obtained.

The oscillator 100 is configured to include the oscillation circuit 50, the resonator element 20, the inductor 24, the varicap capacitor 22, and the container 10. The substrate 14 of the container 10 is provided with the conductor layer 12 between the first surface 14a and the second surface 14b of the substrate 14, and the wiring 42 forming the oscillation loop is provided on the substrate 14 (the first surface 14a). Ceramic with a relative dielectric constant of from 9 to 10 is used for the material of the substrate 14, the distance between the wiring 42 and the conductor layer 12 is set to from 0.35 mm to 0.7 mm, and the area of the wiring 42 is set to from 1.65 mm$^2$ to 2.0 mm$^2$. With this configuration, it is possible to configure the container 10 in which the electrostatic capacitance value between the wiring 42 and the conductor layer 12 is from 0.6 pF to 0.8 pF. Since the container 10 in which the electrostatic capacitance between the wiring 42 forming the oscillation loop and the conductor layer 12 is 0.8 pF or less is used for the oscillator 100, the value of the electrostatic capacitance formed between the wiring and the conductor layer is stabilized in the oscillator 100, and thus it is possible to reduce the possibility of a reduction in the absolute value of the negative resistance of the oscillation circuit. Therefore, it is possible to reduce the possibility of a deterioration in the characteristics, for example, oscillation stability of the oscillator. Hence, it is possible to provide the oscillator 100 in which the possibility of a deterioration in oscillation stability is reduced. Moreover, since the substrate 14 in which the distance between the wiring 42 and the conductor layer 12 is set to 0.7 mm or less is used for the oscillator 100, it is possible, by containing the oscillator 100 in a predetermined height (1.5 mm or less), to realize the oscillator 100 with a low profile.

Embodiment 2

An electronic component 200 according to Embodiment 2 differs from the oscillator 100 of Embodiment 1 in that the resonator element 20 shown in Embodiment 1 is not included in the container. The electronic component 200 functions as an oscillator by electrically connecting a resonator element outside the container to an external connection terminal 254 of the electronic component 200.

Figure 7:
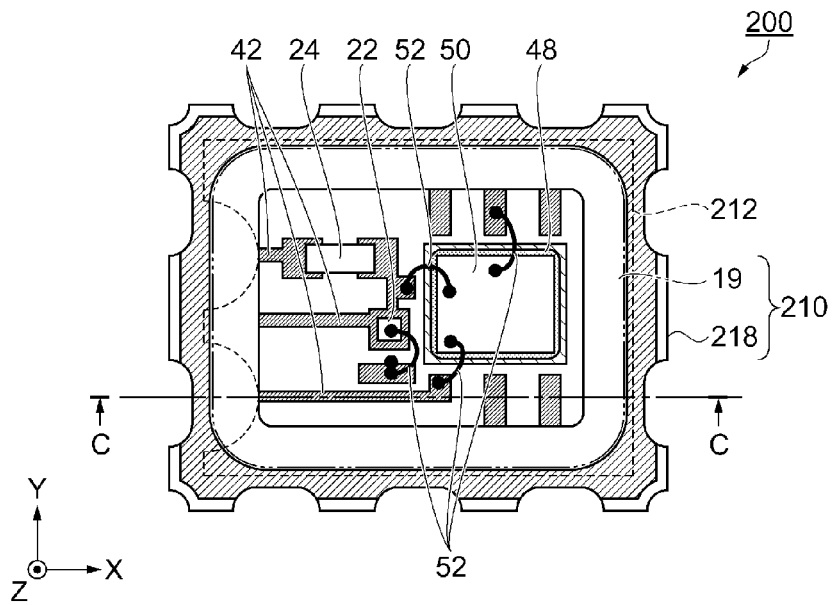
FIG. 7 is a schematic plan view showing a schematic configuration of an electronic component according to Embodiment 2.
Figure 8:
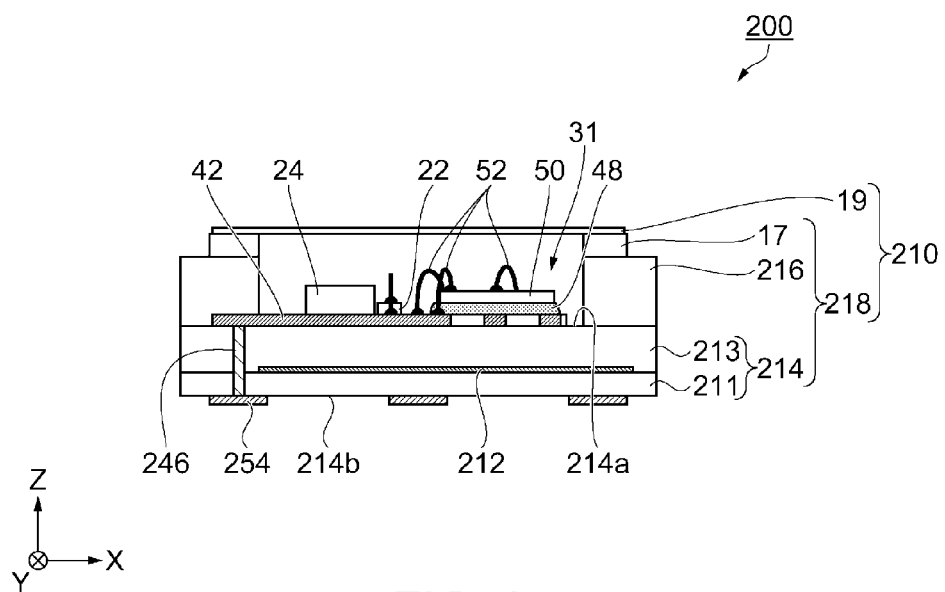
FIG. 8 is a cross-sectional view taken along the line C-C in FIG. 7.

FIG. 7 is a schematic plan view showing a schematic configuration of the electronic component 200 according to Embodiment 2. FIG. 8 is a cross-sectional view taken along the line C-C in FIG. 7. First, the schematic configuration of the electronic component 200 according to Embodiment 2 will be described with reference to FIGS. 7 and 8. The same constituent portions as those of the oscillator 100 of Embodiment 1 are denoted by the same reference numerals, and a redundant description is omitted. Moreover, a container 210 is formed of the same material as the container 10 of Embodiment 1, and thus the description of the material is omitted.

As shown in FIGS. 7 and 8, the electronic component 200 includes an oscillation circuit 50, a varicap capacitor 22, an inductor 24, and the container 210. The container 210 includes a package main body 218 and a lid 19. The package main body 218 is formed in a rectangular box shape to contain the varicap capacitor 22, the inductor 24, and the oscillation circuit 50. In FIG. 7, the lid 19 is shown in a see-through manner for convenience of description.

The package main body 218 is composed of: a substrate 214 that forms the bottom (negative Z-axis side) of the package main body 218; a frame body 216 that forms an accommodating space for the oscillation circuit 50, the varicap capacitor 22, and the inductor 24; and a seam ring 17 as a bonding material for the lid 19.

The substrate 214 includes a first surface 214a on which the oscillation circuit 50 is disposed, and a second surface 214b opposite to the first surface 214a. The first surface 214a of the substrate 214 is provided with wiring 42 that is connected with the oscillation circuit 50 and a resonator element via the external connection terminal 254 of the electronic component 200, described later, to form an oscillation loop. In the electronic component 200 of the embodiment, the oscillation circuit 50, the resonator element as an external component, the varicap capacitor 22, and the inductor 24 are connected by means of the wiring 42, and the oscillation loop is configured to include the oscillation circuit 50, the resonator element as an external component, and the inductor 24.

The substrate 214 includes a conductor layer 212 between the first surface 214a and the second surface 214b. Specifically, the substrate 214 is composed of a first substrate 211, a second substrate 213, and the conductor layer 212 formed between the first substrate 211 and the second substrate 213. The conductor layer 212 is provided between the first surface 214a as a surface of the second substrate 213 on the positive Z-axis side, and the second surface 214b as a surface of the first substrate 211 on the negative Z-axis side.

The conductor layer 212 overlaps, in a plan view, the wiring 42 provided on the first surface 214a. A distance in a thickness direction (Z-axis direction) between the wiring 42 and the conductor layer 212 is from 0.35 mm to 0.7 mm. The inductor 24 electrically connected on the wiring 42 overlaps the conductor layer 212 in the plan view. With this configuration, when the electronic component 200 is mounted on a mounting board, an influence on the electronic component 200 due to the wiring pattern of the mounting board and a component or the like disposed in the vicinity of the electronic component 200, for example, an electromagnetic coupling between at least a portion of the wiring 42 and the inductor 24 and at least a portion of the wiring pattern of the mounting board and the component disposed in the vicinity of the electronic component 200 is reduced, so that the values of the electrostatic capacitances formed between the wiring 42 and the conductor layer 212 and between the inductor 24 and the conductor layer 212 are stabilized. Moreover, when the electronic component 200 is mounted on the mounting board, the conductor layer 212 functions also as a shield electrode between the wiring 42, and the wiring pattern of the mounting board and component wiring disposed in the vicinity of the electronic component 200. Hence, it is possible to reduce a frequency variation before and after the mounting of the electronic component 200 on the mounting board. The wiring 42 is provided to have an area of from 1.65 mm$^2$ to 2.0 mm$^2$ similarly to Embodiment 1.

The second surface 214b of the substrate 214 is provided with a plurality of external connection terminals 254 such as a resonator element connection terminal for connecting the resonator element, a power supply terminal for applying a voltage to the oscillation circuit 50, an output terminal for outputting an oscillation signal output from the oscillation circuit 50, a ground terminal serving a reference potential of the oscillation circuit 50, and a control voltage input terminal for applying a control voltage to the varicap capacitor 22. The conductor layer 212 is electrically connected with the ground terminal of the external connection terminals 254 by means of internal wiring (not shown).

In the plurality of external connection terminals 254, the resonator element connection terminal for connecting the resonator element is electrically connected with the wiring 42 via a via hole 246 that is provided to penetrate from the first surface 214a to the second surface 214b of the substrate 214. The resonator element is connected to the resonator element connection terminal, so that the resonator element is electrically connected with the oscillation circuit 50. With this configuration, the oscillation circuit 50 and the inductor 24, which are included in the interior of the electronic component 200, and the resonator element as an external component constitute the oscillation loop.

As described above, according to the electronic component 200 according to the embodiment, the following advantageous effects can be obtained.

The electronic component 200 is configured to include the oscillation circuit 50, the inductor 24, the varicap capacitor 22, and the container 210. The substrate 214 of the container 210 is provided with the conductor layer 212 between the first surface 214a and the second surface 214b of the substrate 214. The wiring 42 that forms the oscillation loop with the resonator element being connected to the resonator element connection terminal (the external connection terminal 254) of the container 210 is provided on the substrate 214 (the first surface 214a). Ceramic with a relative dielectric constant of from 9 to 10 is used for the material of the substrate 214, the distance between the wiring 42 and the conductor layer 212 is set to from 0.35 mm to 0.7 mm, and the area of the wiring 42 is set to from 1.65 mm$^2$ to 2.0 mm$^2$. With this configuration, it is possible to configure the container 210 in which the electrostatic capacitance value between the wiring 42 and the conductor layer 212 is from 0.6 pF to 0.8 pF. Further, when the electronic component 200 is mounted on the mounting board, the conductor layer 212 functions also as a shield electrode between the wiring 42, and the wiring pattern of the mounting board and the component wiring disposed in the vicinity of the electronic component 200. The container 210 in which the electrostatic capacitance between the conductor layer 212 and the wiring 42 that forms the oscillation loop with the resonator element being connected to the resonator element connection terminal is 0.8 pF or less is used for the electronic component 200. Therefore, the value of the electrostatic capacitance formed between the wiring and the conductor layer is stabilized in the electronic component 200, and, for example, in an oscillator that is configured with the resonator element being connected thereto, it is possible to reduce the possibility of a reduction in the absolute value of the negative resistance of the oscillation circuit. Hence, it is possible to provide the electronic component 200 in which the possibility of a deterioration in oscillation stability is reduced.

Electronic Apparatus

Next, electronic apparatuses including the electronic component according to an embodiment of the invention will be described with reference to FIGS. 9 to 11. In the description, examples of using the electronic component 200 connected with the resonator element are shown.

Figure 9:
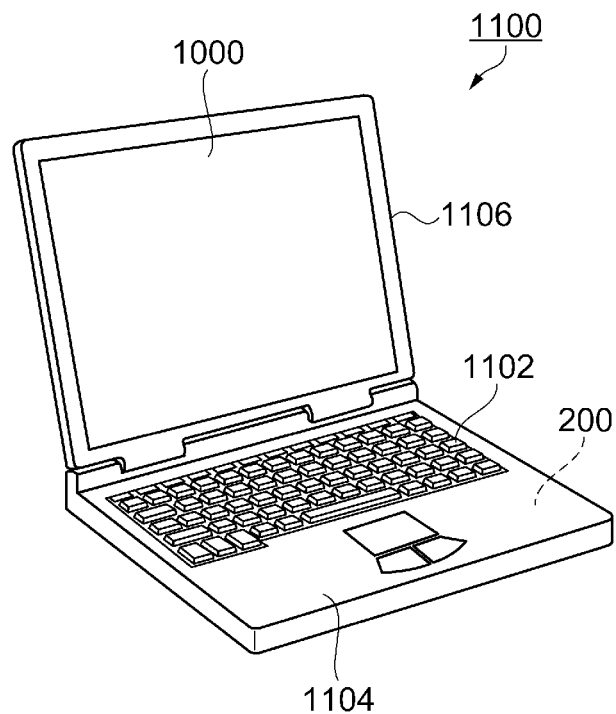
FIG. 9 is a perspective view showing a configuration of a mobile (or notebook) personal computer as an electronic apparatus including the electronic component.

FIG. 9 is a perspective view showing a schematic configuration of a mobile (or notebook) personal computer 1100 as one example of the electronic apparatus including the electronic component according to one embodiment of the invention. As shown in FIG. 9, the personal computer 1100 is composed of a main body portion 1104 including a keyboard 1102, and a display unit 1106 including a display portion 1000. The display unit 1106 is rotatably supported to the main body portion 1104 via a hinge structure portion. Into the personal computer 1100, the electronic component 200 is built.

As described above, the mobile (or notebook) personal computer 1100 as one example of the electronic apparatus includes, as a clock source for example, the electronic component 200 according to one embodiment of the invention, whereby a stable frequency signal is output from the electronic component 200 as a clock source to be supplied to the mobile personal computer 1100. Therefore, the operational reliability of the mobile personal computer 1100 can be improved.

Figure 10:
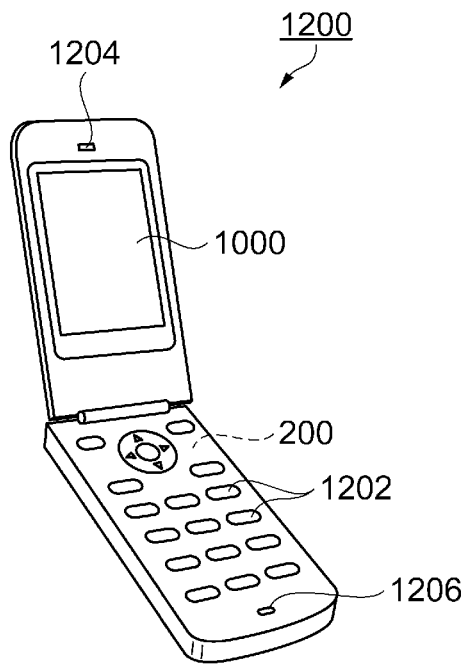
FIG. 10 is a perspective view showing a mobile phone as an electronic apparatus including the electronic component.

FIG. 10 is a perspective view showing a schematic configuration of a mobile phone 1200 (including a PHS) as one example of the electronic apparatus including the electronic component 200 according to one embodiment of the invention. As shown in FIG. 10, the mobile phone 1200 includes a plurality of operation buttons 1202, an earpiece 1204, and a mouthpiece 1206. The display portion 1000 is disposed between the operation buttons 1202 and the earpiece 1204. Into the mobile phone 1200, the electronic component 200 is built.

As described above, the mobile phone (including a PHS) 1200 as one example of the electronic apparatus includes, as a clock source for example, the electronic component 200 according to one embodiment of the invention, whereby a stable frequency signal is output from the electronic component 200 as a clock source to be supplied to the mobile phone 1200. Therefore, the operational reliability of the mobile phone 1200 can be improved.

Figure 11:
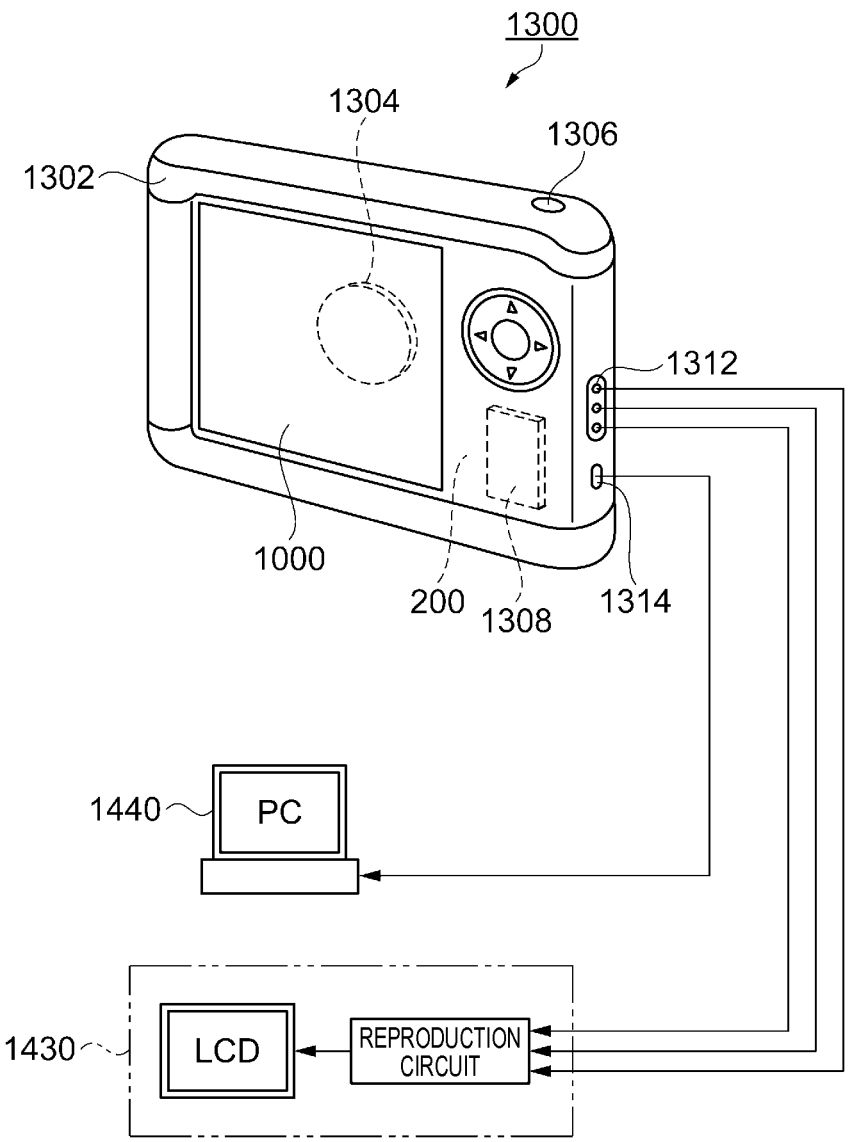
FIG. 11 is a perspective view showing a digital camera as an electronic apparatus including the electronic component.

FIG. 11 is a perspective view showing a schematic configuration of a digital camera 1300 as one example of the electronic apparatus including the electronic component 200 according to one embodiment of the invention. In FIG. 11, connections with external apparatuses are also shown in a simplified manner. Here, existing film cameras expose a silver halide photographic film with an optical image of a subject, whereas the digital camera 1300 photoelectrically converts the optical image of the subject with an imaging device such as a CCD (Charge Coupled Device) to generate imaging signals (image signals).

The display portion 1000 is provided on a back surface of a case (body) 1302 in the digital camera 1300 and configured to perform display based on the imaging signals generated by the CCD. The display portion 1000 functions as a finder that displays the subject as an electronic image. Moreover, on the front side (the rear side in the drawing) of the case 1302, a light receiving unit 1304 including an optical lens (imaging optical system) and the CCD is provided.

When a photographer confirms the subject image displayed on the display portion 1000 and presses down a shutter button 1306, imaging signals of the CCD at the time are transferred to and stored in a memory 1308. In the digital camera 1300, a video signal output terminal 1312 and a data communication input/output terminal 1314 are provided on a side surface of the case 1302. Then, as shown in the drawing, a television monitor 1430 and a personal computer 1440 are connected as necessary to the video signal output terminal 1312 and the data communication input/output terminal 1314, respectively. Further, the imaging signals stored in the memory 1308 are output to the television monitor 1430 or the personal computer 1440 by a predetermined operation. Into the digital camera 1300, the electronic component 200 is built.

As described above, the digital camera 1300 as one example of the electronic apparatus includes, as a clock source for example, the electronic component 200 according to the embodiment of the invention, whereby a stable frequency signal is output from the electronic component 200 as a clock source to be supplied to the digital camera 1300. Therefore, the operational reliability of the digital camera 1300 can be improved.

In addition to the personal computer 1100 (mobile personal computer) in FIG. 9, the mobile phone 1200 in FIG. 10, and the digital camera 1300 in FIG. 11, the electronic component 200 according to one embodiment of the invention can be applied to electronic apparatuses such as inkjet ejection apparatuses (e.g., inkjet printers), laptop personal computers, tablet personal computers, storage area network apparatuses such as routers or switches, local area network apparatuses, apparatuses for mobile terminal base station, television sets, video camcorders, video recorders, car navigation systems, real-time clock devices, pagers, electronic notebooks (including those with communication function), electronic dictionaries, calculators, electronic gaming machines, word processors, workstations, videophones, surveillance television monitors, electronic binoculars, POS terminals, medical apparatuses (e.g. electronic thermometers, sphygmomanometers, blood glucose meters, electrocardiogram measuring systems, ultrasonic diagnosis apparatuses, and electronic endoscopes), fishfinders, various types of measuring instrument, indicators (e.g., indicators used in vehicles, aircraft, and ships), flight simulators, head-mounted displays, motion tracing, motion tracking, motion controllers, and PDR (pedestrian dead reckoning).

Moving Object

Next, a moving object including the electronic component according to an embodiment of the invention will be described with reference to FIG. 12. In the description, an example of using the electronic component 200 connected with the resonator element is shown.

Figure 12:
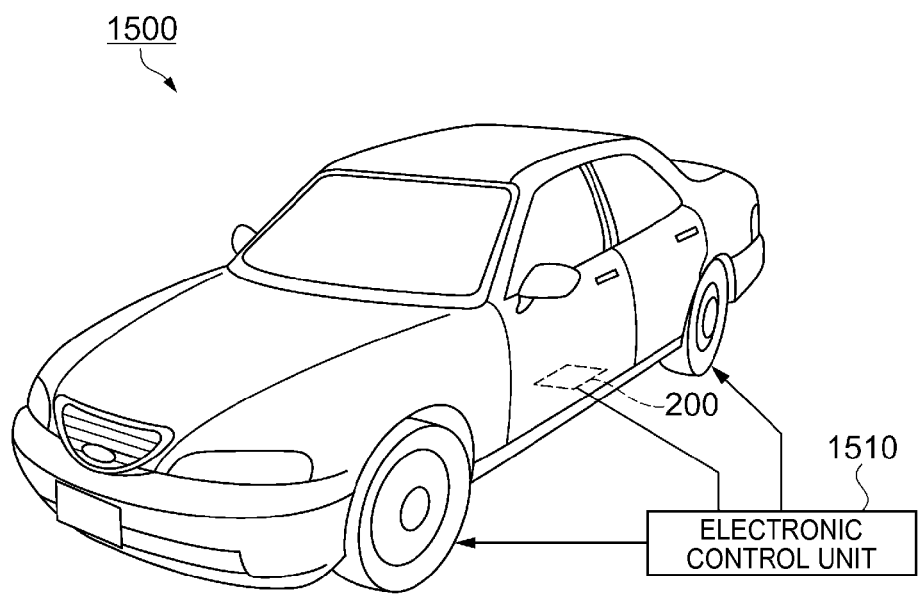
FIG. 12 is a perspective view showing an automobile as a moving object including the electronic component.

FIG. 12 is a perspective view schematically showing an automobile 1500 as one example of a moving object including the electronic component 200 according to one embodiment of the invention.

The electronic component 200 according to the embodiment is mounted in the automobile 1500. As shown in FIG. 12, in the automobile 1500 as the moving object, an electronic control unit (ECU) 1510 into which the electronic component 200 is built to control tires is mounted in a car body. In addition, the electronic component 200 can be widely applied to ECUs such as for keyless entry systems, immobilizers, car navigation systems, car air-conditioners, anti-lock brake systems (ABSs), air bags, tire pressure monitoring systems (TPMSs), engine control, brake systems, battery monitors of hybrid and electric automobiles, and car body attitude control systems.

As described above, the automobile 1500 as one example of the moving object includes, as a clock source for example, the electronic component 200 according to one embodiment of the invention, whereby a stable frequency signal is output from the electronic component 200 as a clock source to be supplied to at least one of the automobile 1500 and the electronic control unit 1510. Therefore, the operational reliability of at least one of the automobile 1500 and the electronic control unit 1510 can be improved.

The entire disclosure of Japanese Patent Application No. 2014-177810 filed Sep. 2, 2014 is expressly incorporated by reference herein.

What is claimed is:

1. An electronic component comprising:
   an oscillation circuit that is electrically connected to a resonator element; and
   a substrate that includes a first surface on which the oscillation circuit and wiring that is electrically connected with the resonator element and the oscillation circuit to form an oscillation loop are disposed, and a second surface opposite to the first surface, wherein
   the substrate includes a conductor layer between the first surface and the second surface,
   the conductor layer overlaps the wiring in a plan view, and
   a distance between the wiring and the conductor layer in a thickness direction as a direction along a direction intersecting the first surface and the second surface is from 0.35 mm to 0.7 mm.

2. An electronic component comprising:
   an oscillation circuit that is electrically connected to a resonator element; and
   a substrate that includes a first surface on which the oscillation circuit and wiring that is electrically connected with the resonator element and the oscillation circuit to form an oscillation loop are disposed, and a second surface opposite to the first surface, wherein
   the substrate includes a conductor layer between the first surface and the second surface,
   the conductor layer overlaps the wiring in a plan view, and
   an electrostatic capacitance value between the wiring and the conductor layer is from 0.6 pF to 0.8 pF.

3. The electronic component according to claim 1, wherein the substrate has a relative dielectric constant of from 9 to 10.

4. The electronic component according to claim 2, wherein the substrate has a relative dielectric constant of from 9 to 10.

5. The electronic component according to claim 1, wherein the wiring has an area of from 1.65 mm$^2$ to 2.0 mm$^2$.

6. The electronic component according to claim 2, wherein the wiring has an area of from 1.65 mm$^2$ to 2.0 mm$^2$.

7. The electronic component according to claim 1, further comprising an electronic element, wherein
   the electronic element is disposed on the first surface, connected to the wiring, and overlaps the conductor layer in the plan view.

8. The electronic component according to claim 2, further comprising an electronic element, wherein
   the electronic element is disposed on the first surface, connected to the wiring, and overlaps the conductor layer in the plan view.

9. The electronic component according to claim 7, wherein the electronic element is an inductor.

10. The electronic component according to claim 8, wherein
    the electronic element is an inductor.

11. The electronic component according to claim 1, wherein
    the conductor layer is grounded.

12. The electronic component according to claim 2, wherein
    the conductor layer is grounded.

13. An oscillator comprising:
    the electronic component according to claim 1; and
    the resonator element.

14. An oscillator comprising:
    the electronic component according to claim 2; and
    the resonator element.

15. The oscillator according to claim 13, wherein
    the resonator element overlaps the conductor layer in a plan view.

16. The oscillator according to claim 14, wherein
    the resonator element overlaps the conductor layer in a plan view.

17. An electronic apparatus comprising the electronic component according to claim 1.

18. An electronic apparatus comprising the electronic component according to claim 2.

19. A moving object comprising the electronic component according to claim 1.

20. A moving object comprising the electronic component according to claim 2.

* * * * *